(12) United States Patent
Chen et al.

(10) Patent No.: US 7,989,321 B2
(45) Date of Patent: Aug. 2, 2011

(54) SEMICONDUCTOR DEVICE GATE STRUCTURE INCLUDING A GETTERING LAYER

(75) Inventors: Chien-Hao Chen, Chuangwei Township, Ilan County (TW); Yong-Tian Hou, Singapore (TW); Peng-Fu Hsu, Hsinchu (TW); Kuo-Tai Huang, Hsinchu (TW); Donald Y. Chao, Hsinchu (TW); Cheng-Lung Hung, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 215 days.

(21) Appl. No.: 12/257,165

(22) Filed: Oct. 23, 2008

(65) Prior Publication Data

US 2010/0048010 A1 Feb. 25, 2010

Related U.S. Application Data

(60) Provisional application No. 61/091,664, filed on Aug. 25, 2008, provisional application No. 61/090,674, filed on Aug. 21, 2008.

(51) Int. Cl.
*H01L 21/322* (2006.01)
*H01L 21/32* (2006.01)

(52) U.S. Cl. . 438/476; 438/460; 438/473; 257/E21.321; 257/E29.108

(58) Field of Classification Search .................. 438/460, 438/473, 476
See application file for complete search history.

(56) References Cited

U.S. PATENT DOCUMENTS

| 5,348,894 | A  | * | 9/1994  | Gnade et al. | 438/396 |
|-----------|----|---|---------|--------------|---------|
| 6,300,244 | B1 | * | 10/2001 | Itabashi et al. | 438/678 |
| 6,645,857 | B1 | * | 11/2003 | Whitefield et al. | 438/675 |
| 6,797,572 | B1 |   | 9/2004  | Jeon et al. | |
| 7,052,943 | B2 | * | 5/2006  | Yamazaki et al. | 438/166 |
| 7,063,893 | B2 | * | 6/2006  | Hoffman | 428/432 |
| 7,067,195 | B2 | * | 6/2006  | Hoffman et al. | 428/432 |
| 7,297,630 | B2 | * | 11/2007 | Kim | 438/648 |
| 7,306,982 | B2 | * | 12/2007 | Yamazaki et al. | 438/166 |
| 7,459,379 | B2 | * | 12/2008 | Kokubo et al. | 438/476 |
| 7,611,972 | B2 | * | 11/2009 | Govindarajan | 438/476 |
| 7,670,641 | B2 | * | 3/2010  | Hoffman et al. | 427/165 |
| 7,683,418 | B2 | * | 3/2010  | Park et al. | 257/310 |

(Continued)

FOREIGN PATENT DOCUMENTS

CN 1949532 4/2007

OTHER PUBLICATIONS

Changhwan Choi et al., "Aggressively Scaled UltraThin Undoped HfO2 Gate Dielectrode (EOT < 0.7 nm), With TaN Gate Electrode Using Engineered Interface Layer", IEEE Electron Device Letters, vol. 26, No. 7, Jul. 2005, pp. 454-457.

(Continued)

*Primary Examiner* — Fernando L Toledo
(74) *Attorney, Agent, or Firm* — Haynes and Boone, LLP

(57) ABSTRACT

A method is provided that allows for maintaining a desired equivalent oxide thickness (EOT) by reducing the thickness of an interfacial layer in a gate structure. An interfacial layer is formed on a substrate, a gate dielectric layer such as, a high-k gate dielectric, is formed on the interfacial layer. A gettering layer is formed on the substrate overlying the interfacial layer. The gettering layer may function to getter oxygen from the interfacial layer such that the interfacial layer thickness is decreased and/or restricted from growth.

18 Claims, 7 Drawing Sheets

U.S. PATENT DOCUMENTS

| | | | |
|---|---|---|---|
| 7,758,915 B2 * | 7/2010 | Hoffman | 427/165 |
| 2002/0030283 A1 * | 3/2002 | Itabashi et al. | 257/774 |
| 2002/0197935 A1 * | 12/2002 | Mueller et al. | 451/36 |
| 2003/0151074 A1 | 8/2003 | Zheng et al. | |
| 2003/0183915 A1 * | 10/2003 | Scheifers et al. | 257/682 |
| 2003/0228472 A1 * | 12/2003 | Hoffman et al. | 428/432 |
| 2003/0232468 A1 * | 12/2003 | Ohnuma | 438/166 |
| 2004/0028955 A1 * | 2/2004 | Hoffman | 428/702 |
| 2004/0097055 A1 * | 5/2004 | Henley et al. | 438/471 |
| 2004/0101997 A1 * | 5/2004 | Maekawa et al. | 438/151 |
| 2004/0152240 A1 * | 8/2004 | Dangelo | 438/122 |
| 2005/0032336 A1 * | 2/2005 | Yamazaki et al. | 438/476 |
| 2005/0282341 A1 | 12/2005 | Park et al. | |
| 2006/0189156 A1 | 8/2006 | Doczy et al. | |
| 2006/0193976 A1 * | 8/2006 | Hoffman | 427/162 |
| 2006/0222763 A1 * | 10/2006 | Hoffman et al. | 427/162 |
| 2007/0059910 A1 | 3/2007 | Pei et al. | |
| 2007/0248756 A1 * | 10/2007 | Krisko et al. | 427/255.15 |
| 2008/0183235 A1 * | 7/2008 | Stancer et al. | 607/36 |
| 2009/0152651 A1 * | 6/2009 | Bu et al. | 257/411 |
| 2009/0267191 A1 * | 10/2009 | Minato et al. | 257/617 |
| 2010/0044806 A1 * | 2/2010 | Hou et al. | 257/412 |

OTHER PUBLICATIONS

Chinese Patent Office, Office action mailed Aug. 4, 2010, Application No. 200910141835.8, 6 pages.

Kim, Hyoungsub, et al., "Engineering chemically abrupt high-k metal oxide/silicon interfaces using an oxygen-gettering metal overlayer," Journal of Applied Physics, vol. 96, No. 6, Sep. 15, 2004, 6 pages.

* cited by examiner

SEMICONDUCTOR DEVICE GATE STRUCTURE INCLUDING A GETTERING LAYER

CROSS-REFERENCE

This application claims priority to Provisional Application Ser. No. 61/091,664, filed on Aug. 25, 2008, entitled "Semiconductor Device Gate Structure Including A Gettering Layer," the entire disclosure of which is incorporated herein by reference. The present disclosure is related to Provisional Application Ser. No. 61/090,674, filed Aug. 21, 2008, entitled "Integrated Circuit Metal Gate Structure and Method of Fabrication", the entire disclosure of which is incorporated herein by reference. Utility application Ser. No. 12/264,822 claims priority to above described provisional application Ser. No. 61/090,674, and was filed Nov. 4, 2008.

BACKGROUND

The present disclosure relates generally an integrated circuit device and, more particularly, a method of forming a gate structure of an IC device.

As technology nodes decrease, semiconductor fabrication processes have introduced the use of gate dielectric materials having a high dielectric constant (e.g., high-k dielectrics). The high-k dielectrics exhibit a higher dielectric constant than the traditionally used silicon dioxide which allow for thicker dielectric layers to be used to obtain similar equivalent oxide thicknesses (EOTs). The processes also benefit from the introduction of metal gate structures providing a lower resistance than the traditional polysilicon gate structures. Therefore, transistors including gate structures having a high-k dielectric plus metal gate stack are advantageous.

However, fabrication processes providing for use of a high-k dielectric plus metal gate structure face challenges. For example, an interface layer may be required between the high-k gate dielectric layer (e.g., $HfO_2$) and the substrate (e.g., Si) on which is it formed. The thickness of this interface layer also contributes to the EOT of the gate structure. Thus, as gate lengths decrease, controlling the thickness of the interface layer becomes more and more critical.

Therefore, what is needed is an improved method of forming a gate structure.

SUMMARY

In one embodiment, a method of fabricating a semiconductor device is provided. The method includes providing a semiconductor substrate and forming an interface layer on the semiconductor substrate. A gate dielectric layer is formed on the interface layer. A gettering layer is formed on gate dielectric layer dielectric layer. The gettering layer includes an oxygen gettering dielectric composition.

In another embodiment, a method of fabricating a gate structure includes providing a substrate. An interface layer is formed on the substrate. The interface layer includes silicon oxide having a first thickness. A gate dielectric layer may be formed on the interface layer. A gettering layer is formed overlying the interface layer. The thickness of the interface layer is reduced, to a second thickness, by gettering oxygen from the interface layer to the gettering layer. The gettering layer may include a metal layer and/or a dielectric layer.

In an embodiment, a method of semiconductor fabrication is provided including providing a semiconductor substrate and forming an interface layer on the semiconductor substrate. A gate dielectric layer is formed on the interface layer. A gettering metal layer is formed on the gate dielectric layer. The gettering metal layer including an oxygen gettering composition. A metal gate electrode on the substrate overlying the gate dielectric layer.

DETAILED DESCRIPTION

Figure 1:
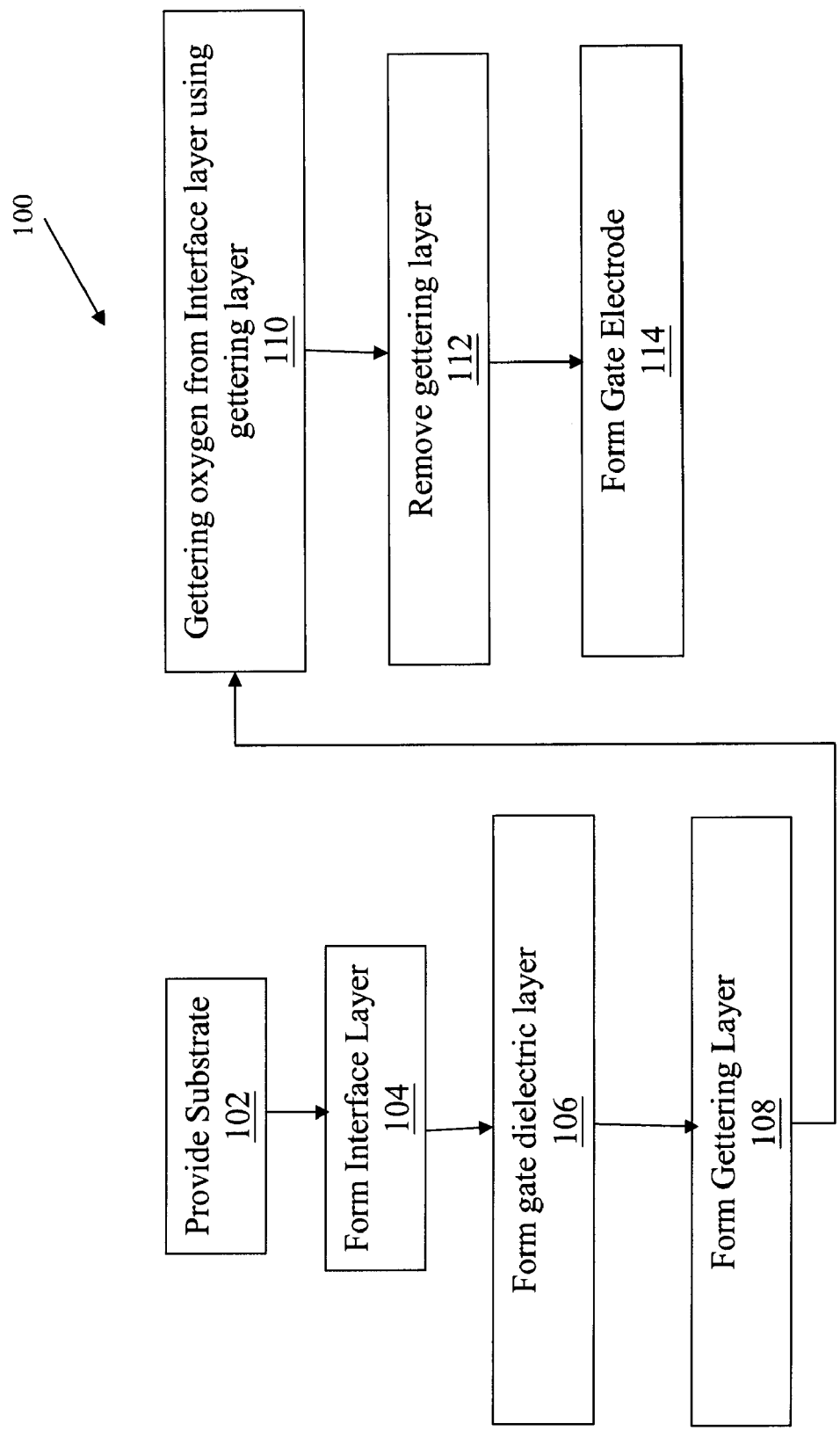
FIG. 1 is a flowchart illustrating an embodiment of a method of forming a gate structure.

The present disclosure relates generally to forming an integrated circuit device on a substrate and, more particularly, to fabricating a gate structure as part of a semiconductor device (e.g., a FET device of an integrated circuit). It is understood, however, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Furthermore, included are descriptions of a first layer or feature "on," "overlying," and like descriptions a second layer or feature. These terms include embodiments where the first and second layer are in direct contact and those where one or more layers or feature are interposing the first and second layer.

Referring to FIG. 1, illustrated is a flowchart providing an embodiment of a method 100 of forming a gate structure. FIGS. 2-9 provide exemplary devices corresponding to the fabrication steps of FIG. 1. The method 100 may be included during processing of an integrated circuit, or portion thereof, that may comprise static random access memory (SRAM) and/or other logic circuits, passive components such as resistors, capacitors, and inductors, and active components such as P-channel field effect transistors (PFET), N-channel FET (NFET), metal-oxide semiconductor field effect transistors (MOSFET), complementary metal-oxide semiconductor (CMOS) transistors, bipolar transistors, high voltage transistors, high frequency transistors, other memory cells, and combinations thereof.

Figure 2:
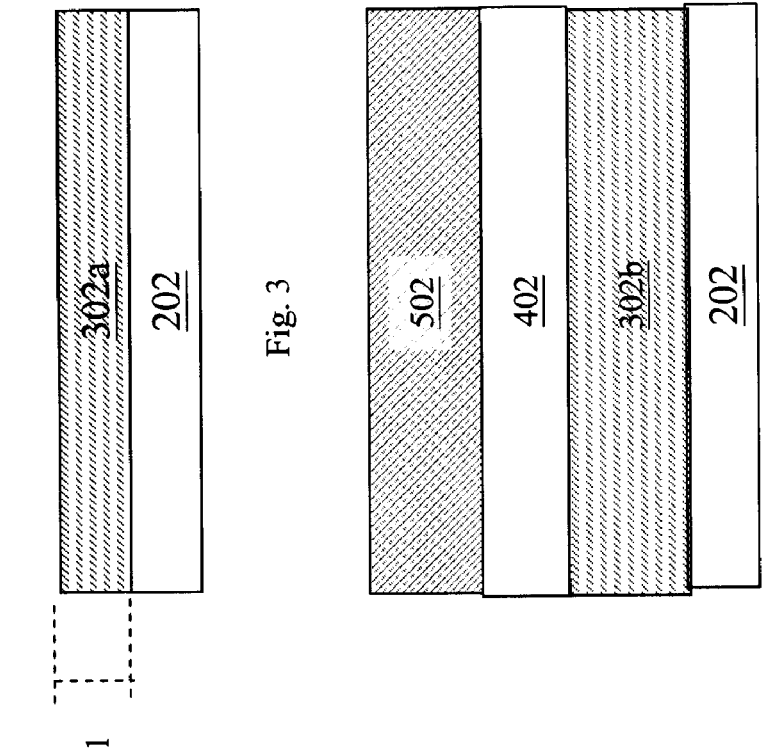

The method 100 begins at step 102 where a substrate (e.g., wafer) is provided. In the example of FIG. 2, a substrate 202 is provided. In an embodiment, the substrate 202 includes a silicon substrate (e.g., wafer) in crystalline structure. The substrate 202 may include various doping configurations depending on design requirements as is known in the art (e.g., p-type substrate or n-type substrate). Other examples of the substrate 202 may also include other elementary semiconductors such as germanium and diamond. Alternatively, the substrate 202 may include a compound semiconductor such as, silicon carbide, gallium arsenide, indium arsenide, or indium phosphide. Further, the substrate 202 may optionally include an epitaxial layer (epi layer), may be strained for performance enhancement, and/or may include a silicon-on-insulator (SOI) structure. Further still, the substrate 202 may include a plurality of features formed thereon, including active regions, source and drain regions in the active regions, isolation regions (e.g., shallow trench isolation features), and/or other features known in the art.

Figure 3:
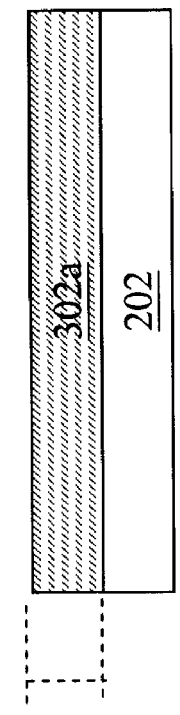
FIGS. 2-9 are cross-sectional views of a semiconductor device corresponding to the steps of an embodiment of the method of FIG. 1.

The method 100 then proceeds to step 104 where an interface layer is formed on the substrate. In the example of FIG. 3, an interface layer 302a is formed on the substrate 202. The interface layer 302a may include silicon, oxygen, and/or nitrogen. In an embodiment, the interface layer 302a includes $SiO_2$. In an embodiment, the interface layer 302a includes a thickness t1 of approximately 6 to 8 angstroms. The interface layer 302a may be formed by atomic layer deposition (ALD) or other suitable process. (It is noted that the interface layer of the gate structures provided in embodiments of FIGS. 3-9 are annotated 302x, x being "a," "b," or "c" indicative of the thickness of the interface layer.)

Figure 4:
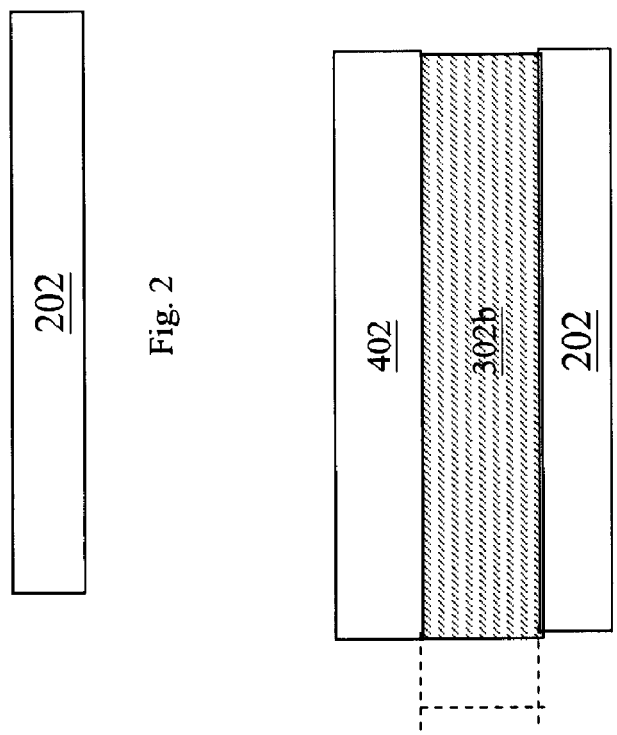

The method 100 then proceeds to step 106 where a gate dielectric layer is formed on the substrate. The gate dielectric layer may be formed on the interface layer. In an embodiment, gate dielectric layer includes a high-k (high dielectric constant) material. In the example of FIG. 4, a gate dielectric layer 402 includes a high-k material. In an embodiment, the high-k dielectric material includes hafnium oxide ($HfO_2$). Other examples of high-k dielectrics include hafnium silicon oxide (HfSiO), hafnium silicon oxynitride (HfSiON), hafnium tantalum oxide (HfTaO), hafnium titanium oxide (HfTiO), hafnium zirconium oxide (HfZrO), combinations thereof, and/or other suitable materials. In embodiments, additional layers, such as capping layers and/or buffer layers, may be formed over the interface layer, overlying and/or underlying the gate dielectric layer. For example, a capping layer may be formed between the gate dielectric layer and a subsequently deposited metal gate electrode. The capping layer may include a dielectric or metal including metal oxide composition (e.g., Ti, TiO2). The gate dielectric layer may be formed by ALD, CVD, PVD, oxidation, and/or other suitable processes.

As illustrated by FIG. 4, the interface layer may increase in thickness to form interface layer 302b. The increase in thickness may be on account of processing (e.g., elevated temperature processing) to fabricate the gate dielectric layer such as, the gate dielectric layer 402 and/or other layers such as, capping or buffer layers. In an embodiment, ALD processes (e.g., to form a gate dielectric layer) provide for increasing thickness of the interface layer. In an embodiment, the interface layer 302b includes a thickness t2 between approximately 10 and 12 angstroms.

The increased thickness interface layer may be disadvantageous because it may contribute additional thickness to the gate dielectric and negatively effect the equivalent oxide thickness (EOT). This may be particularly restrictive as gate length dimensions decrease. Therefore, a reduction and/or a prevention of growth of the thickness of an interface layer is desired.

Figure 5:
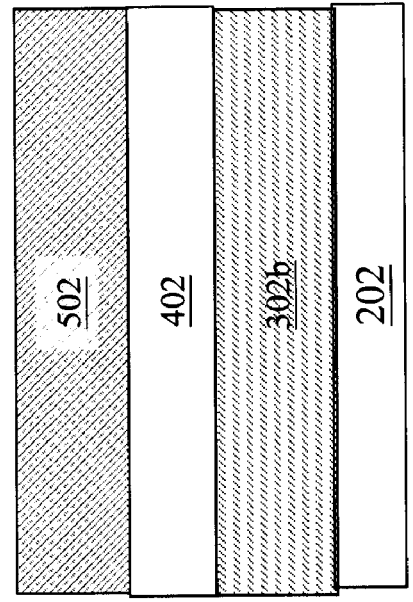

The method 100 then proceeds to step 108 where a gettering layer is formed. The gettering layer is provided to getter (e.g., move) oxygen from the interface layer to the gettering layer. The gettering layer may be formed by PVD, ALD, CVD, and/or other suitable processes. In the example of FIG. 5, the gettering layer 502 is formed.

In an embodiment, the gettering layer 502 is an oxygen-gettering dielectric layer. The dielectric layer may include a silicon-rich dielectric materials. In an embodiment, the dielectric layer may include nitrogen containing dielectrics suitable for gettering oxygen. Examples of oxygen-gettering dielectric materials include SiN, SiON, SiC, SiGe, and/or other suitable compositions. In an embodiment, the gettering layer 502 is an oxygen-gettering metal layer. The oxygen-gettering metal layer may include metal, metal compounds, and/or metal alloys including Ti, Ta, Zr, Hf, W, Mo, and/or combinations thereof.

The gettering layer 502 may include a plurality of gettering layers. In an embodiment, the gettering layer 502 includes a dielectric layer and a metal layer. For example, a gettering layering including an oxygen-gettering metal layer and a layer including silicon-rich dielectric and/or nitrogen containing dielectric may be formed.

Figure 7:
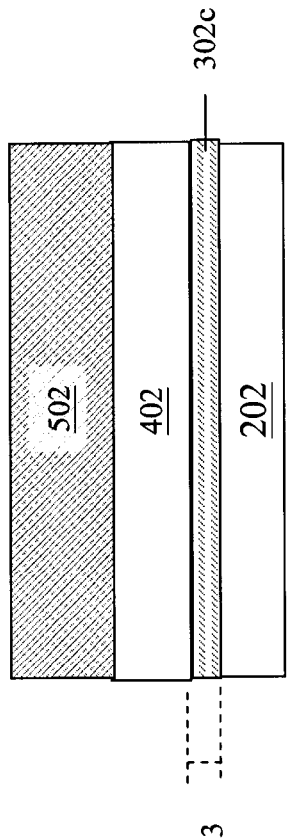
Figure 6:
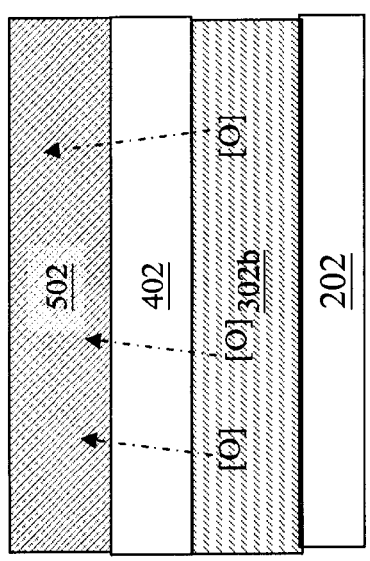
Figure 9:
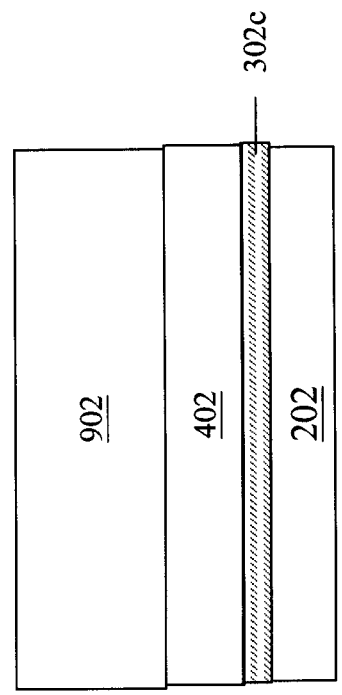
Figure 8:
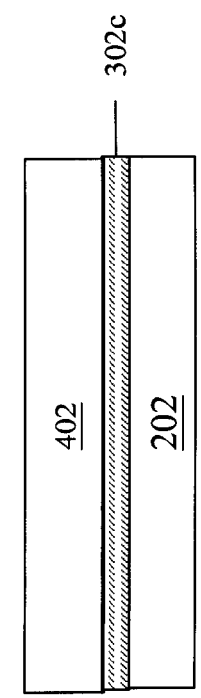

The method then proceeds to step 110 where oxygen gettering occurs. Oxygen is gettered (moved) from the interface layer using the gettering layer. Step 110 may be performed subsequently to and/or simultaneously with the deposition of the getter layer, described above with reference to step 108. The example of FIG. 6 illustrates the gettering of oxygen from the interface layer 302b to the gettering layer 502. The gettering includes releasing the oxygen from the interface layer 302b, diffusion (e.g., movement) of the oxygen, and capture of the oxygen at the gettering site—the gettering layer 502. The gettering of the oxygen, in particular the release of oxygen from the interface layer 302b may include a thermal process (e.g., an exposure to an elevated temperature). The gettering of the oxygen provides for a decrease in the thickness of the interface layer. The gettering of the oxygen may also result in an increase in thickness of the gettering layer. The example of FIG. 7 illustrates the interface layer 302c is formed by gettering oxygen from the interface layer 302b of FIG. 6. In an embodiment, the interface layer 302c includes a thickness t3 which is between approximately 0 and 5 angstroms.

In an embodiment, the method 100 then proceeds to provide an additional high temperature process(es). For example, an anneal may be performed to stabilize the high-k dielectric and/or other layers included in the gate structure. The process(es) may be done with no or minimal re-growth of the interface layer because of the presence of the gettering layer. The high temperature process may include a furnace, rapid thermal anneal, laser spike anneal, flash anneal, and/or other suitable processes.

Referring again to FIG. 1, the method 100 then proceeds to step 112 where the gettering layer is removed. The gettering layer may be removed by dry etch, plasma, wet etch, stripping, chemical mechanical polish (CMP), and/or other suitable processes. Referring to the example of FIG. 8, a gate stack including the substrate 202, interface layer 302c, and the gate dielectric layer 402 is provided. In an embodiment, the step 112 is omitted and one or more of the gettering layers remain on the substrate. In an embodiment, one or more of the gettering layers remains on the substrate and contributes to a work function for a metal gate structure.

The method 100 then proceeds to step 114 where a metal gate is formed overlying the gate dielectric. Referring to the example of FIG. 9, the metal gate 902 is formed on the gate dielectric layer 402. The metal gate 902 may include one or more layers including Ti, TiN, TaN, Ta, TaC, TaSiN, W, WN, MoN, MoON, $RuO_2$, and/or other suitable materials. The gate may include one or more layers formed by PVD, CVD, ALD, plating, and/or other suitable processes. Examples of metals that may be deposited include p-type metal materials and n-type metal materials. P-type metal materials include compositions such as ruthenium, palladium, platinum, cobalt, nickel, and conductive metal oxides, and/or other suitable materials. N-type metal materials include compositions such as hafnium, zirconium, titanium, tantalum, aluminum, metal carbides (e.g., hafnium carbide, zirconium carbide, titanium carbide, aluminum carbide), aluminides, and/or other suitable materials. Other materials may deposited in addition to the work function metals (e.g., fill metals) and may include titanium nitride, tungsten, titanium, aluminum, tantalum, tantalum nitride, cobalt, copper, nickel, and/or other suitable materials. The metal gate may include capping layer(s).

In embodiments, the method 100 may continue to include further processing steps such as formation of interconnects, contacts, capping layers, and/or other suitable features. The method 100 may be included in a "gate last" process where the metal gate structure described herein is formed in a trench. The trench being provided by the removal of a dummy gate structure (e.g., sacrificial polysilicon gate). Alternatively, the method 100 may be included in a "gate first" fabrication process.

Figure 10:
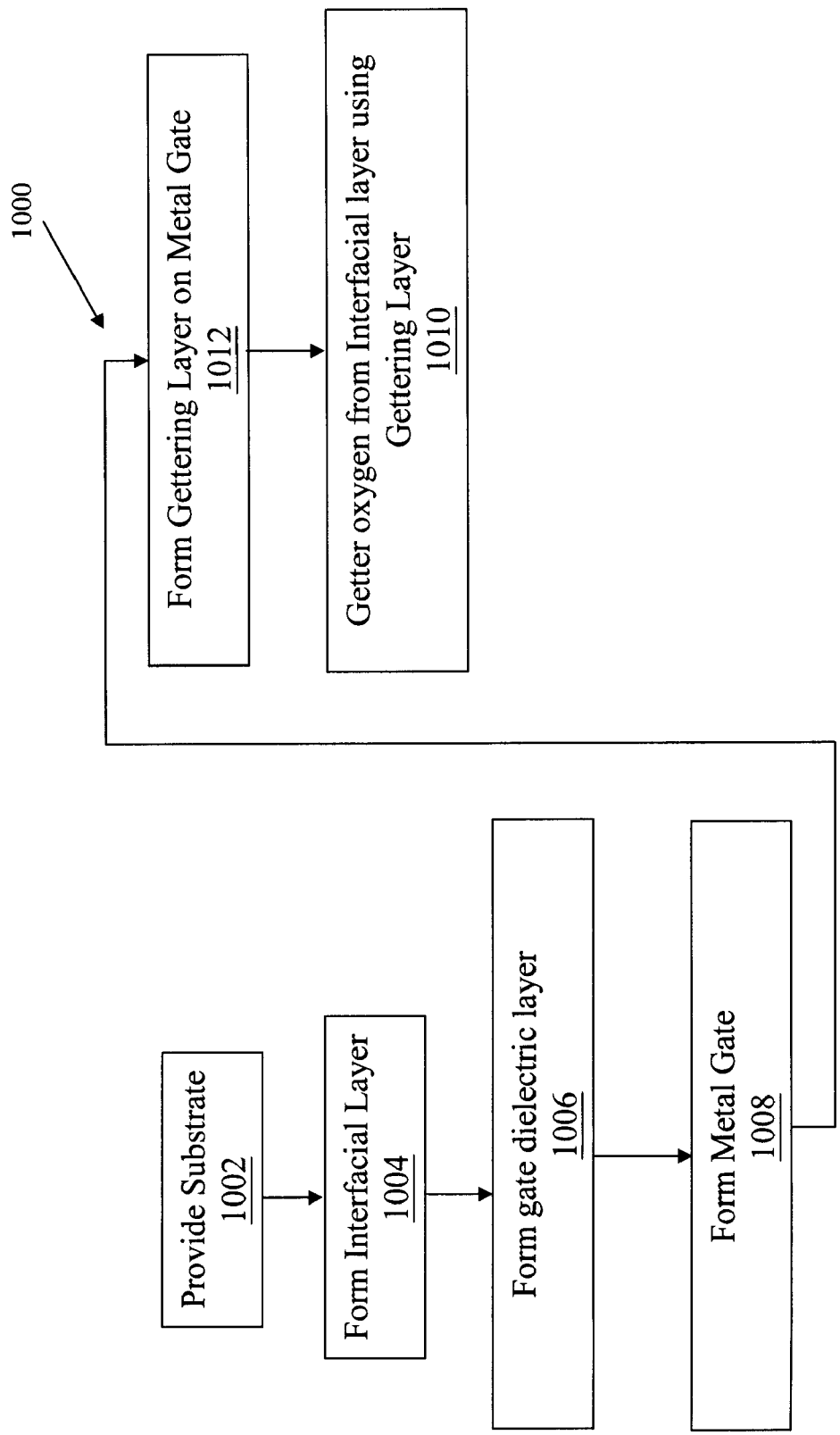
FIG. 10 is a flowchart illustrating an alternative embodiment of a method of forming a gate structure.

Referring now to FIG. 10, illustrated is a method 1000 for formation of a gate structure. The method 1000 may be useful for formation of a metal gate structure where the interface layer is decreased in thickness and/or restricted from increasing in thickness during subsequent processing. The method 1000 beings at step 1002 where a substrate is provided. The substrate may be substantially similar to the substrate 202, described above with reference to FIG. 2.

The method 1000 then proceeds to step 1004 where an interfacial layer is formed on the substrate. The interfacial layer may be substantially similar to the interface layer 302 described above with reference to FIG. 3. For example, in an embodiment, the interfacial layer includes $SiO_2$.

The method 1000 then proceeds step 1006 where a gate dielectric layer is formed on the substrate. The gate dielectric layer may be substantially similar to the gate dielectric layer 402 described above with reference to FIG. 4. For example, in an embodiment, the gate dielectric layer includes a high-k dielectric. In embodiments, one or more additional layers including capping layers, buffer layers, and the like may be formed in addition to the gate dielectric layer, for example, underlying and/or overlying the gate dielectric layer.

Figure 11:
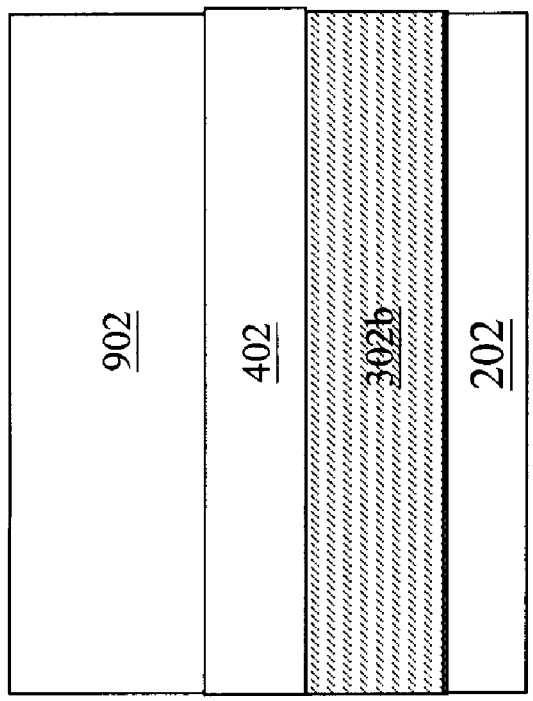

The method 1000 then proceeds to step 1008 where a gate electrode is formed on the substrate overlying the gate dielectric layer. In an embodiment, a metal gate is formed. The gate may be substantially similar to the metal gate 902 described above with reference to FIG. 9. The gate may be formed directly on the high-k dielectric layer or on an overlying capping or buffer layer. The gate may include a plurality of layers. The gate includes at least one work function metal layer. Referring to the example of FIG. 11, the metal gate 902 is formed on the substrate 202, and in particular overlying the gate dielectric layer 402 (and/or other capping, buffer layers included).

Figure 12:
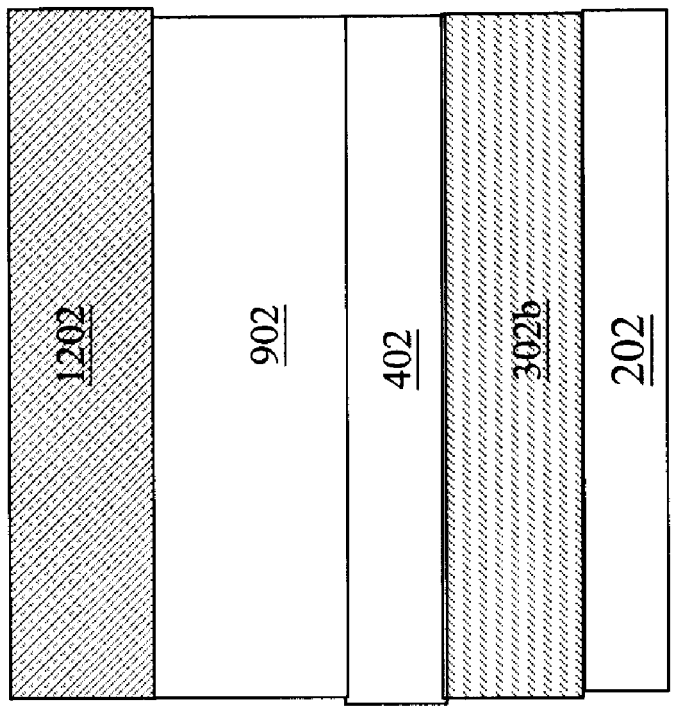
FIGS. 11-14 are cross-sectional views of a semiconductor device corresponding to steps of an embodiment of the method of FIG. 15.

The method 1000 then proceeds to step 1010 where a gettering layer is formed on the metal gate. The gettering layer may include an oxygen-gettering material. In an embodiment, the gettering layer includes an oxygen-gettering metal composition. Examples of metal compositions include elemental metals, compounds, or alloys including Ti, Ta, Zr, Hf, W, Mo, combinations thereof, and/or other suitable materials. Referring to the example of FIG. 12, the gettering layer 1202 is formed on the metal gate 902. The gettering layer 1202 may include a plurality of layers. The gettering layer 1202 may be substantially similar to the gettering layer(s) 502, described above with reference to FIG. 5.

Figure 14:
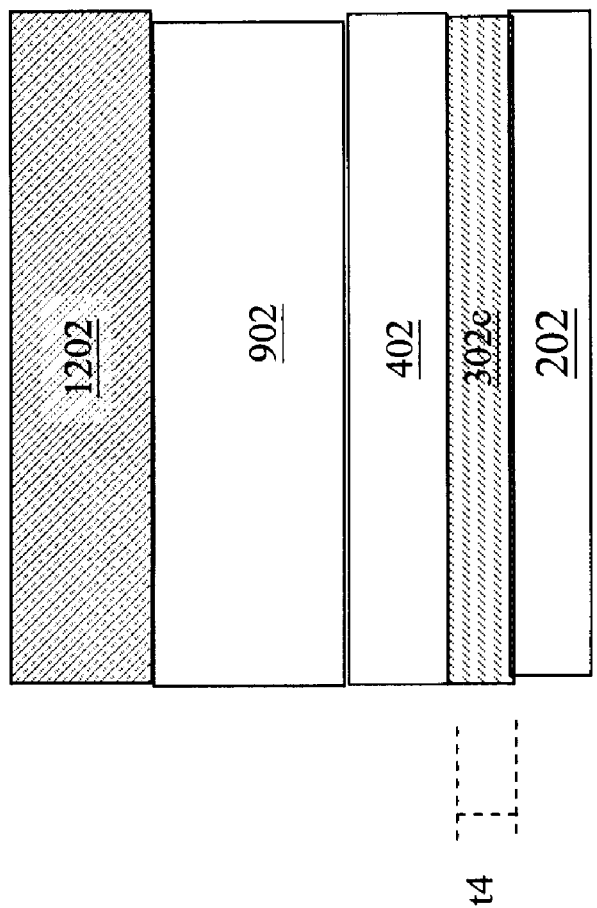
Figure 13:
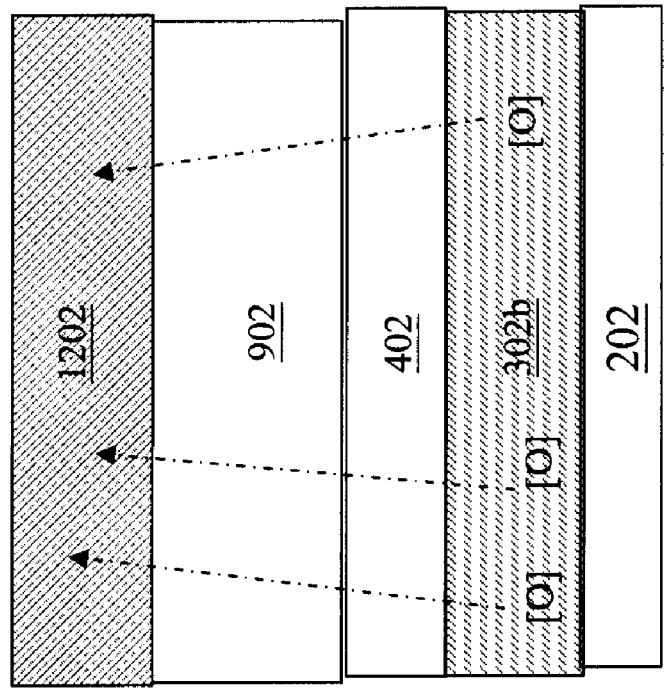

The method 1000 then proceeds to step 1012 where oxygen is gettered from the interfacial layer. Oxygen is gettered (moved) from the interfacial layer using the gettering layer. The example of FIG. 13 illustrates the gettering of oxygen from the interface layer 302b to the gettering layer 1202. The gettering includes releasing the oxygen from the interface layer 302b, diffusion (e.g., movement) of the oxygen, and capture of the oxygen at the gettering site—the gettering layer 1202. The gettering of the oxygen, in particular the release of oxygen from the interface layer 302b may include a thermal process (e.g., a process including an elevated temperature to initiate the release). The gettering of the oxygen provides for a decrease in the thickness of the interfacial layer. The example of FIG. 14 illustrates the interface layer 302c is formed by shrinking the interface layer 302b of FIG. 13. In an embodiment, the interface layer 302c includes a thickness t4 which is between approximately 0 and 5 angstroms. Thus, the gate structure 1300 is formed includes the decreased thickness interface layer 302c.

In an embodiment, the method 1000 then proceeds to provide an additional high temperature process. For example, an anneal may be performed to stabilize the high-k dielectric and/or other layers included in the gate structure. This process may be done with no or minimal re-growth of the interfacial layer because of the presence of the gettering layer. The high temperature process may include a furnace, rapid thermal anneal, laser spike anneal, flash anneal, and/or other suitable processes.

In an embodiment, the method 1000 proceeds to remove the gettering layer from the gate structure. The gettering layer may be removed by dry etch, plasma, wet etch, stripping, chemical mechanical polish (CMP), and/or other suitable processes. In an alternative embodiment, the gettering layer remains on the gate structure. In an embodiment, the gettering layer may function to adjust and/or provide the work function of the metal gate.

In embodiments, the method 1000 may continue to include further processing steps such as formation of interconnects, contacts, capping layers, and/or other suitable features. The method 1000 may be included in a "gate last" process where the metal gate structure described herein is formed in a trench. The trench is provided by the removal of a dummy gate structure (e.g., sacrificial polysilicon gate). Alternatively, the method 1000 may be included in a "gate first" process.

Figure 15:
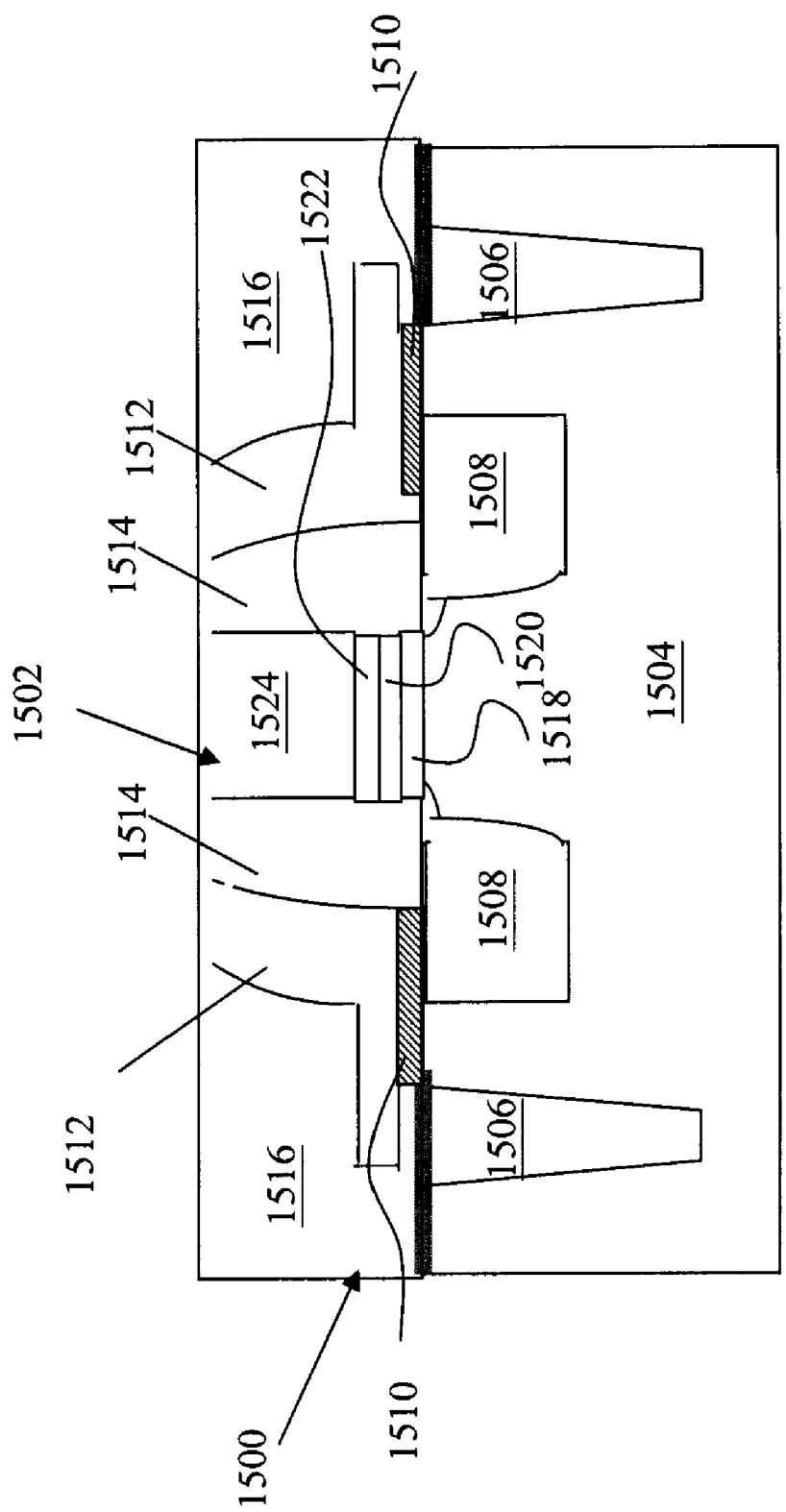
FIG. 15 is a cross-sectional view of an embodiment of a semiconductor device which may benefit from the present disclosure.

Referring now to FIG. 15, illustrated a device 1500 including a gate structure 1502. The device 1500 includes a substrate 1504, shallow trench isolation features 1506, source/drain regions 1508, contacts 1510, a contact etch stop layer (CESL) 1512, spacers 1514, a dielectric layer (e.g., interlayer dielectric layer (ILD)) 1516. The gate structure 1502 includes an interface layer 1518, a gate dielectric layer 1520, a capping layer 1522, and metal gate layer 1524. The device 1500 may be formed using the method 100, the method 1000, and/or portions thereof. The device 1500 may be fabricated using a gate last process or a gate first process.

The substrate 1504 may be substantially similar to the substrate 202 described above with reference to FIG. 2. The STI features 1506 formed in the substrate 1504 may isolate one or more devices (e.g., transistors) from each other. The STI features 1506 may include silicon oxide, silicon nitride, silicon oxynitride, fluoride-doped silicate glass (FSG), and/or a low k dielectric material. Other isolation methods and/or features are possible in lieu of or in addition to STI. The STI features 1506 may be formed using processes such as reactive ion etch (RIE) of the substrate 1504 to form trenches which are then filled with insulator material using deposition processes followed by CMP process.

The spacers 1514 may be formed on both sidewalls of the gate structure 1502. The spacers 1514 may be formed of silicon oxide, silicon nitride, silicon oxynitride, silicon carbide, fluoride-doped silicate glass (FSG), a low k dielectric material, combinations thereof, and/or other suitable material. The spacers 1514 may have a multiple layer structure, for example, including one or more liner layers. The liner layers may include a dielectric material such as silicon oxide, silicon nitride, and/or other suitable materials. The spacers 1514 may be formed by methods including deposition of suitable dielectric material and anisotropically etching the material to form the spacer 1514 profile.

The source/drain regions 1508 including lightly doped source/drain regions and heavy doped source/drain regions, are disposed on the substrate 1504 adjacent the gate structure 1502. The source/drain regions 1508 may be formed by implanting p-type or n-type dopants or impurities into the substrate 1504 depending on the desired transistor configuration. The source/drain features 1508 may be formed by methods including photolithography, ion implantation, diffusion, and/or other suitable processes. The contact features 1510, coupled to the source/drain regions 1508, may include silicide. The contact features 1510 may be formed on the source/drain regions 1508 by a salicide (self-aligned silicide) process. The contacts 1510 may include nickel silicide, cobalt silicide, tungsten silicide, tantalum silicide, titanium silicide, platinum silicide, erbium silicide, palladium silicide, or combinations thereof. The contact etch stop layer (CESL) 1512 may be formed of silicon nitride, silicon oxynitride, and/or other suitable materials. The CESL 1512 composition may be selected based upon etching selectivity to one or more additional features of the semiconductor device 1500.

The dielectric layer 1516 such as an inter-layer (or level) dielectric (ILD) layer is disposed on the substrate overlying the CESL 1512 and formed by chemical vapor deposition (CVD), high density plasma CVD, spin-on, sputtering, or other suitable methods. The dielectric layer 1516 may include silicon oxide, silicon oxynitride, or a low k material. In an embodiment, the dielectric layer 1516 is a high density plasma (HDP) dielectric.

The interface layer 1518 may include silicon, oxygen, and/or nitrogen. In an embodiment, the interface layer 1518 includes $SiO_2$. The interface layer 1518 may include a thickness of less than approximately 5 angstroms. The interface layer 1518 may be formed by atomic layer deposition (ALD) or other suitable process. The gate dielectric layer 1520 may be substantially similar to the gate dielectric layer 402, described above with reference to FIG. 4. In an embodiment, the gate dielectric layer 1520 includes a high-k dielectric. The capping layer 1522 may include metal oxide, metal alloy oxide, dielectric, and/or other materials. In an embodiment, the capping layer 1522 may be omitted. The metal gate 1524 forms the gate electrode of the gate structure 1502. The metal gate 1524 may include a plurality of layers, for example, a plurality of metal layers. The metal gate 1524 may include work function layers, fill layers, capping layers, and/or other suitable layers found in a metal gate electrode structure. The metal gate 1524 may include one or more layers including Ti, TiN, TaN, Ta, TaC, TaSiN, W, WN, MoN, MoON, $RuO_2$, and/or other suitable materials. The metal gate 1524 may include one or more layers formed by PVD, CVD, ALD, plating, and/or other suitable processes. Examples of metals that may included in the metal gate 1524 include p-type metal materials and n-type metal materials. P-type metal materials include compositions such as ruthenium, palladium, platinum, cobalt, nickel, and conductive metal oxides, and/or other suitable materials. N-type metal materials include compositions such as hafnium, zirconium, titanium, tantalum, aluminum, metal carbides (e.g., hafnium carbide, zirconium carbide, titanium carbide, aluminum carbide), aluminides, and/or other suitable materials. In addition to the n-type and/or p-type metals, a fill metal may be deposited to substantially or completely fill the remainder of the trench. The fill metal may include titanium nitride, tungsten, titanium, aluminum, tantalum, tantalum nitride, cobalt, copper, nickel, and/or other suitable materials. The fill metal may be deposited using CVD, PVD, plating, and/or other suitable processes. Other layers may be present on the device 1500 including gettering layers, capping layers, buffer layers, metal layers, interconnects, and/or other known features.

In summary, methods are provided that allow for formation of a thin high-K dielectric—metal gate structure. The methods provide for a gettering layer to remove (e.g., getter) oxygen from an interface layer. The gettering may reduces the thickness of the interfacial layer and/or restrict growth of the layer during subsequent processing, including processes at elevated temperatures. This is advantageous as it controls the equivalent oxide thickness of the gate structure. The methods provide for using a oxygen-gettering layer formed over the interface layer. The gettering layer may include a dielectric and/or metal layer. As described above, the gettering layer may be removed from the gate stack, or remain in the structure.

While the preceding description shows and describes one or more embodiments, it will be understood by those skilled in the art that various changes in form and detail may be made therein without departing from the spirit and scope of the present disclosure. Therefore, the claims should be interpreted in a broad manner, consistent with the present disclosure.

What is claimed is:

1. A method of fabricating a semiconductor device, comprising:
   providing a semiconductor substrate;
   forming an interface layer on the semiconductor substrate;
   forming a gate dielectric layer on the interface layer;
   forming a gettering layer on the gate dielectric layer, wherein the gettering layer includes an oxygen-gettering, dielectric composition;
   removing the gettering layer; and
   forming a gate electrode on the high-k dielectric layer, wherein the gate electrode includes metal.

2. The method of claim 1, wherein the gate dielectric layer includes a high-k dielectric.

3. The method of claim 1, wherein the interface layer includes silicon oxide.

4. The method of claim 1, wherein the gettering layer is selected from a group consisting of SiN, SiON, SiC, SiGe, and combinations thereof.

5. The method of claim 1, wherein the gettering layer includes silicon.

6. The method of claim 1, further comprising:
   reducing the thickness of the interface layer, wherein the reducing includes transfer of oxygen from the interface layer to the gettering layer.

7. A method of fabricating a gate structure, comprising:
   providing a substrate;
   forming an interface layer on the substrate, wherein the interface layer includes silicon oxide having a first thickness;
   forming a gettering layer overlying the interface layer;
   reducing the thickness of the interface layer to a second thickness by gettering oxygen from the interface layer to the gettering layer;
   removing the gettering layer; and
   depositing a metal layer to form a gate electrode.

8. The method of claim 7, wherein the reducing the thickness includes a high temperature process.

9. The method of claim 7, wherein the metal layer is selected from the group consisting of Ti, TiN, TaN, Ta, TaC, TaSiN, W, WN, MoN, MoON, $RuO_2$ and/or combinations thereof.

10. The method of claim 7, wherein the second thickness is less than approximately 5 angstroms.

11. The method of claim 7, further comprising:
forming a metal gate electrode underlying the gettering layer.

12. The method of claim 7, wherein the gettering layer includes an oxygen-gettering dielectric.

13. The method of claim 7, wherein the gettering layer includes an oxygen-gettering metal.

14. A method of semiconductor fabrication, comprising:
providing a semiconductor substrate;
forming an interface layer on the semiconductor substrate;
forming a gate dielectric layer on the interface layer; and
forming a gettering metal layer on the gate dielectric layer, wherein the gettering metal layer includes an oxygen-gettering composition; and
forming a metal gate electrode on the substrate overlying the gate dielectric layer.

15. The method of claim 14, wherein the gettering metal layer includes a metal selected from the group consisting of Ti, Ta, Zr, Hf, W, Mo, and combinations thereof.

16. The method of claim 14, wherein the forming the metal gate electrode includes removing the gettering metal layer.

17. The method of claim 14, wherein the forming the metal gate electrode includes forming the metal gate electrode underlying the gettering metal layer.

18. The method of claim 14, wherein the metal gate electrode includes a metal selected from the group consisting of Ti, TiN, Ta, Ta, TaC, TaSiN, W, WN, MoN, MoON, $RuO_2$, and combinations thereof.

* * * * *